United States Patent [19]

Chiba

[11] Patent Number: 5,161,177
[45] Date of Patent: Nov. 3, 1992

[54] SUBSTRATE HOLDING APPARATUS FOR HOLDING A SUBSTRATE IN AN EXPOSURE APPARATUS

[75] Inventor: Yuji Chiba, Isehara, Japan

[73] Assignee: Canon Kabushiki Kaisha, Tokyo, Japan

[21] Appl. No.: 779,897

[22] Filed: Oct. 21, 1991

[30] Foreign Application Priority Data

Oct. 26, 1990 [JP] Japan .................. 2-287290

[51] Int. Cl.⁵ .............................. G21K 5/00
[52] U.S. Cl. ...................... 378/34; 378/208; 250/491.1
[58] Field of Search ............ 378/34.35, 204, 205, 378/208; 250/491.1, 492.1, 492.2

[56] References Cited

U.S. PATENT DOCUMENTS

| | | | |
|---|---|---|---|
| 4,651,009 | 3/1987 | Totsuka | 378/34 |
| 4,969,168 | 11/1990 | Sakamoto et al. | 378/34 |
| 4,979,195 | 12/1990 | Tabata et al. | 375/208 |
| 5,073,912 | 12/1991 | Kobayashi et al. | 250/492.1 |

FOREIGN PATENT DOCUMENTS 2-100311 4/1990 Japan .

*Primary Examiner*—David P. Porta
*Attorney, Agent, or Firm*—Fitzpatrick, Cella, Harper & Scinto

[57] ABSTRACT

A substrate holding apparatus for vertically holding a substrate to be exposed by radiation includes a substrate stage having a substrate holding surface for attracting a substrate. The substrate holding surface is divided into an inner peripheral portion and an outer peripheral portion by a groove formed in the substrate stage. A magnetic member is fitted into the groove of the substrate stage, and at least a magnetic unit is embedded in the magnetic member. The magnetic unit includes a permanent magnet and an electromagnet for eliminating a magnetic force of the permanent magnet when energized. Further, a moving device is provided for moving the magnetic member together with the magnetic unit in a direction of the depth of the groove between a first position in which the magnetic force of the permanent magnet is effective for the substrate on the substrate holding surface and a second position in which the magnetic force of the permanent magnet is ineffective for the substrate on the substrate holding surface. The electromagnet need not be energized during a substrate positioning period if the magnetic member with the magnetic unit is brought to the second position.

8 Claims, 7 Drawing Sheets

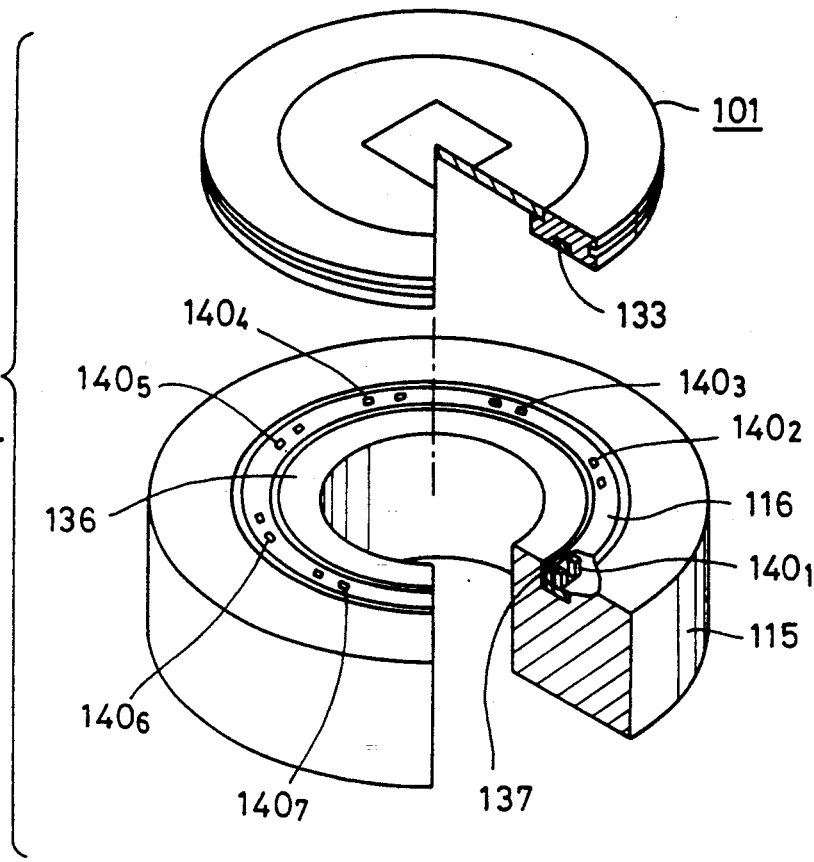
FIG. I
PRIOR ART
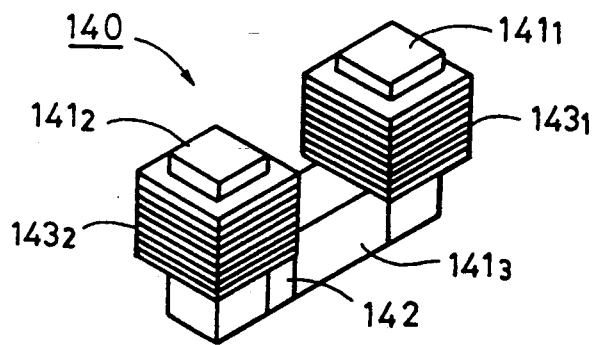
FIG. 2
PRIOR ART

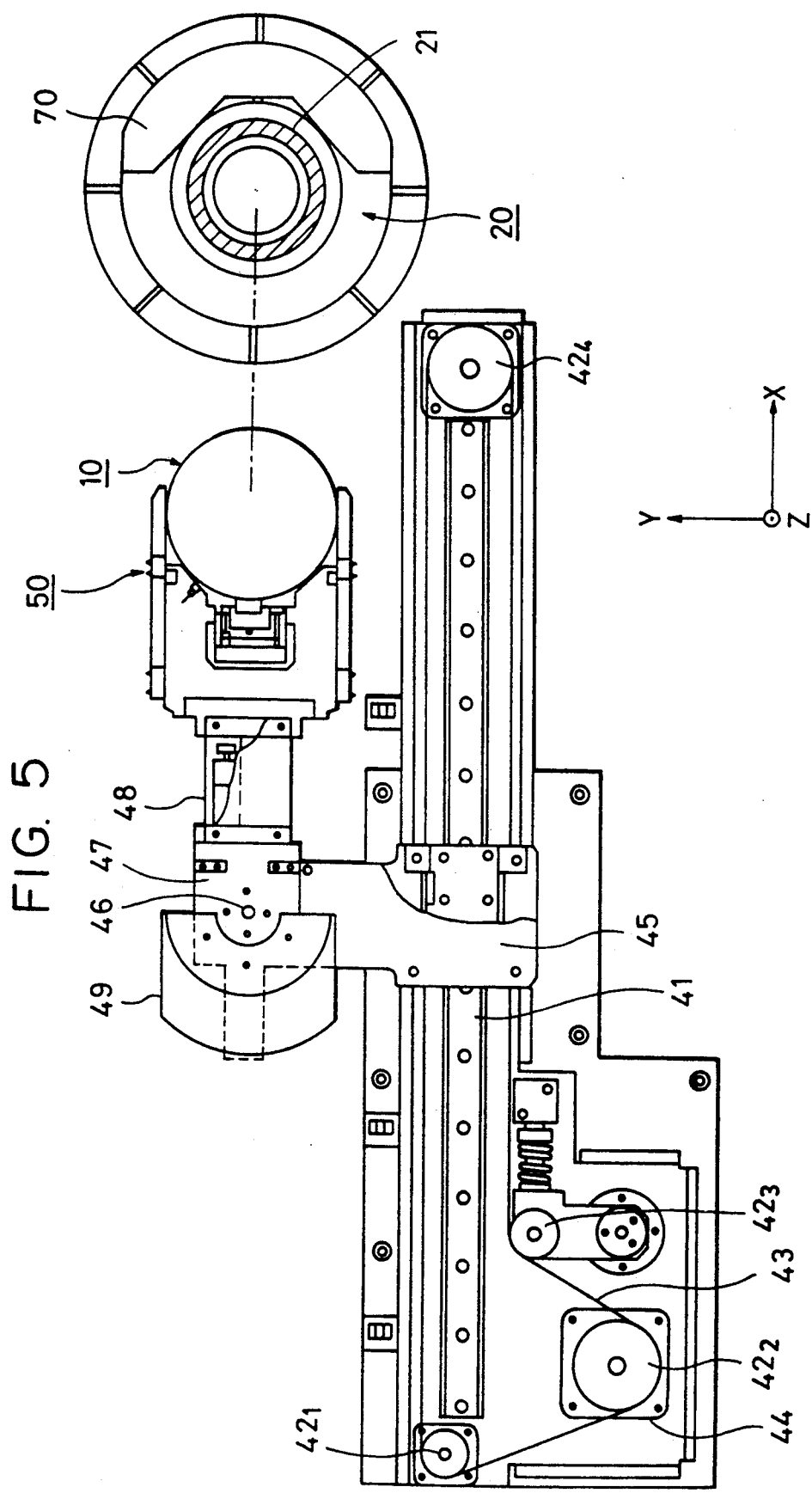

SUBSTRATE HOLDING APPARATUS FOR HOLDING A SUBSTRATE IN AN EXPOSURE APPARATUS

BACKGROUND OF THE INVENTION

1. Field of the Invention

The present invention relates to a substrate holding apparatus or a mask stage base in an exposure apparatus such as an X-ray exposure apparatus in which synchrotron radiation light is utilized as an exposure light, and particularly, to a substrate holding apparatus for vertically holding a substrate or a mask by a magnetic attracting force.

2. Related Background Art

In recent years, there has been a growing need to improve refining techniques in semiconductor-device fabricating apparatuses especially as capacity of semiconductor memories becomes greater and greater.

An X-ray exposure apparatus in which synchrotron radiation light is utilized as an exposure light has been developed as a means for improving the refining such as X-ray exposure apparatus, a wafer and mask are vertically held and exposed to the exposure light, differently from conventional exposure apparatuses which use, for example, far ultra-violet rays as an exposure light (see Japanese patent application unexamined publication No. 2-100311).

There are a vacuum-attraction system, a magnetic-attraction system and so forth as a mask holding apparatus for attracting and holding the mask. In the vacuum-attraction system, however, there is the problem that the mask drops when troubles occur in a vacuum source and the like because the mask is vertically held in the X-ray exposure apparatus. In contrast, in the magnetic-attraction system, there is the advantage that dropping of the mask is prevented because the mask is attracted by a magnetic force of a permanent magnet.

FIG. 1 shows an example of prior art mask holding apparatuses of the magnetic-attraction system.

The mask holding apparatus includes an annular mask stage 115. The shape of its cross section is square or rectangular. A chuck surface (when a mask 101 is attracted) of the mask stage 115 is divided into an inner peripheral portion and an outer peripheral portion by a continuously extending groove 137 whose cross section has a rectangular shape. The mask holding apparatus further includes a magnetic ring 116 fitted into the groove 137.

The inner portion of the mask stage 115 is flatly lapped with a high precision to be a close tolerance flat surface 136 (e.g., flatness is below $1\mu$ and roughness is below $0.08\mu$). Thus, a high degree of flatness of the attracted mask 101 is obtained. Further, eight magnetic units $140_1$–$140_8$ (the magnetic unit $140_8$ is not shown) are disposed under the magnetic ring 116, and the mask 101 is attracted and held by magnetically attracting a magnetic ring 133 embedded in the mask 101 by the magnetic units $140_1$–$140_8$.

As shown in FIG. 2, the magnetic unit $140_1$ includes three yokes $141_1$, $141_2$ and $141_3$, a permanent magnet 142, a coil $143_1$ wound on the yoke $141_1$ and a coil $143_2$ wound on the yoke $141_2$. The magnetic unit $140_1$ takes an attracting state in which the magnetic force of the permanent magnet 142 is effective when no current flows in the two coils $143_1$ and $143_2$. In contrast, the magnetic force of the permanent magnet 142 is eliminated by magnetic forces generated by the coils $143_1$ and $143_2$ to be ineffective when current flows in each of the coils $143_1$ and $143_2$. The same is true with the other magnetic units $140_2$–$140_8$.

In the prior art mask holding apparatus, however, current should continuously flow in each of the coils $143_1$ and $143_2$ to maintain each of the magnetic units $140_1$–$140_8$ in the ineffective state during a positioning operation period (e.g., about 2–3 seconds) in which the mask holding apparatus receives the mask 101 from a mask transporting means such as a mask hand. As a result, heat generated by the current flow is conducted to the mask 101 to generate thermal strains in the mask 101, leading to the degradation of exposure accuracy.

SUMMARY OF THE INVENTION

An object of this invention is to provide a substrate holding apparatus in which the generation of heat during the substrate positioning operation is prevented to attain an improved exposure accuracy.

Another object of this invention is to provide a method for positioning a substrate on a substrate holding surface of a substrate holding apparatus accurately to attain an improved exposure accuracy.

According to one aspect of the present invention, a substrate holding apparatus for holding a substrate to be exposed by radiation, which is transported by a substrate transporting apparatus, includes a substrate stage having a substrate holding surface for attracting a substrate. The substrate holding surface is divided into an inner peripheral portion and an outer peripheral portion by at least a groove formed in the stage. There are further provided a magnetic member fitted into the groove of the substrate stage, at least a magnetic unit embedded in the magnetic member and moving means for moving the magnetic member together with the magnetic unit in a direction of the depth of the groove. The magnetic unit includes a permanent magnet and an electromagnet for eliminating the magnetic force of the permanent magnet when energized. The moving means moves the magnetic member between a first position in which the magnetic force of the permanent magnet is effective for the substrate on the substrate holding surface and a second position in which the magnetic force of the permanent magnet is ineffective for the substrate on the substrate holding surface.

According to another aspect of the present invention, a substrate holding apparatus for holding a substrate to be exposed by radiation, which is transported by a substrate transporting apparatus, includes a substrate stage having a substrate holding surface for attracting a substrate, at least a magnetic unit movably disposed in the substrate stage and moving means for moving the magnetic unit between a first position and a second position. The magnetic unit includes a permanent magnet and an electromagnet for eliminating the magnetic force of the permanent magnet when energized. In the first position, the magnetic force of the permanent magnet is effective for the substrate on the substrate holding surface, while, in the second position, the magnetic force of the permanent magnet is ineffective for the substrate on the substrate holding surface.

According to still another aspect of the present invention, a method for positioning a substrate on a substrate holding surface of a substrate holding apparatus recited above, includes a step of bringing the magnetic unit to the second position, a step of putting the substrate on the substrate holding surface by a substrate transporting apparatus, a step of bringing the magnetic unit to the first position, a step of disabling the electromagnet, a step of releasing the substrate from the substrate transporting apparatus, a step of re-grasping the substrate by the substrate transporting apparatus, a step of energizing the electromagnet, a step of bringing the magnetic unit to the second position, a step of disabling the electromagnet, a step of positioning the substrate by the substrate transporting apparatus, a step of energizing the electromagnet, a step of bringing the magnetic unit to the first position, a step of disabling the electromagnet and a step of releasing the substrate from the substrate transporting apparatus.

These advantages and others will be more readily understood in connection with the following detailed description, claims and drawings.

BRIEF DESCRIPTION OF THE DRAWINGS

FIG. 1 is a partially-broken perspective view showing the structure of a prior art mask holding apparatus of a magnetic-attraction system.

FIG. 2 is a perspective view showing the structure of a magnetic unit shown in FIG. 1.

FIG. 5 is a front view of an example of mask transporting systems used in an X-ray exposure apparatus in which the mask holding apparatus of FIG. 1 is contained and synchrotron radiation is used as a light source.

DETAILED DESCRIPTION OF THE PREFERRED EMBODIMENT

Figure 3:
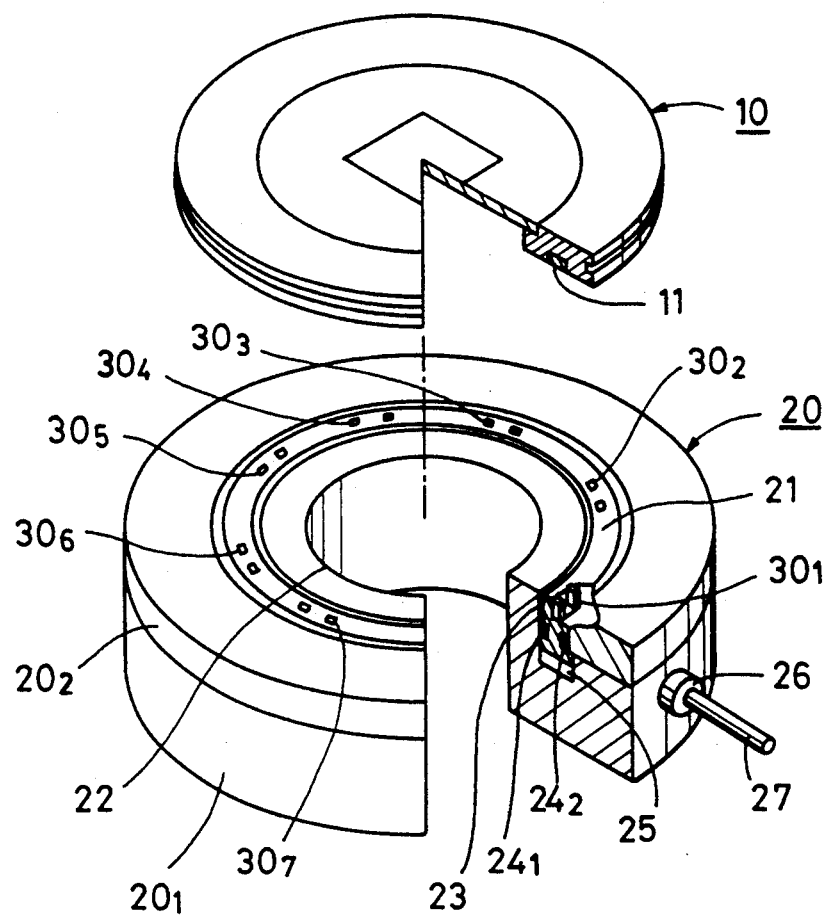
FIG. 3 is a partially-broken perspective view showing the structure of a first embodiment of a mask holding apparatus of a magnetic-attraction system according to the present invention.

FIG. 3 is a partially-broken perspective view showing the structure of a first embodiment of a magnetic-attraction system.

A mask holding apparatus of the first embodiment is different from the prior art mask holding apparatus shown in FIG. 1 in the following points.

Figure 4A:
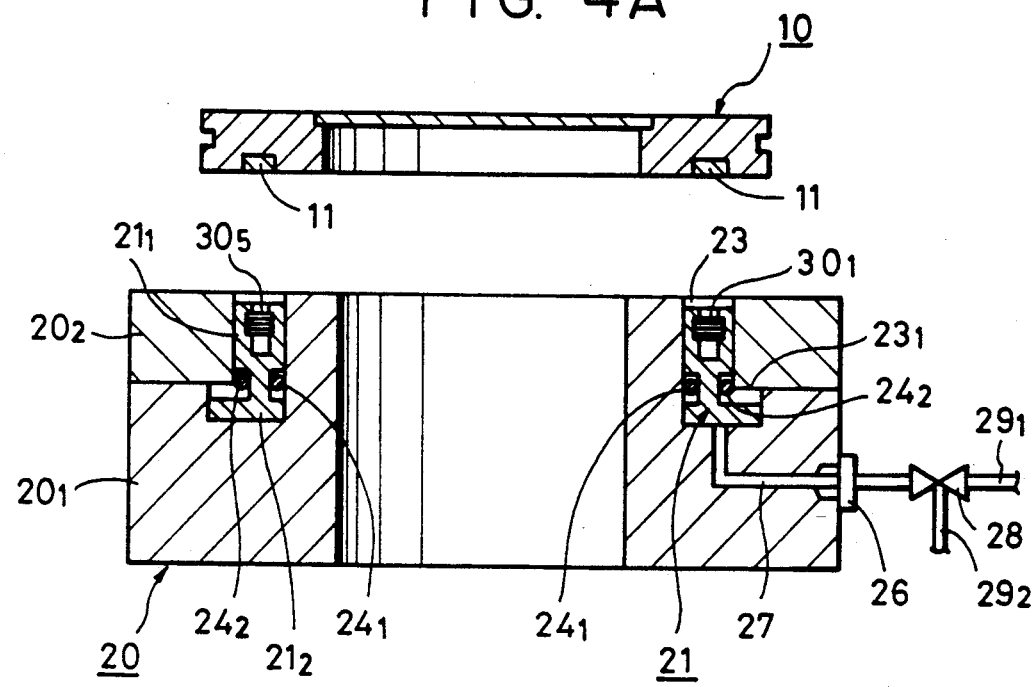
FIG. 4A is a cross-sectional view of the first embodiment in its non-attracting state.

(1) A groove 23 which divides a chuck surface of an annular mask stage 20 (when a mask 10 is attracted) into an inner peripheral portion and an outer peripheral portion has a cross-sectional shape of a letter L. That is, as shown in FIG. 4A, a first member $20_1$ and a second member $20_2$ constitute the mask stage 20, and there is in the groove 23 a stepped portion $23_1$ in which its width at the bottom side is greater than that at the side of the chuck surface.

(2) A magnetic ring 21 fitted into the groove 23 includes an upper portion $21_1$ having a width which is substantially equal to that of the groove 23 at the side of the chuck surface and a bottom portion $21_2$ having a width which is substantially equal to that of the groove 23 at the bottom side. A space 25 is formed between the bottom surface of the magnetic ring 21 and the bottom surface of the groove 23.

(3) There are provided two O rings $24_1$ and $24_2$ which serve as a means for sealing the space 25 between a middle portion of the magnetic ring 21 and the mask stage 20.

(4) There are disposed a three-way valve 28, a line for connecting the space 25 to the three-way valve 28, a first line $29_1$ for connecting the three-way valve 28 to a vacuum source (not shown) and a second line $29_2$ for connecting the three-way valve 28 to a He gas bottle (not shown). The line 27 inside of the mask stage 20 is connected with the line 27 outside of the mask stage 20 by a connector 26.

Similar to the prior art apparatus, a chuck surface (when a mask 10 is attracted) of the mask stage 20 is divided into an inner peripheral portion and an outer peripheral portion by the continuously extending groove 23 and the inner peripheral portion of the mask stage 20 is flatly lapped with a high precision to be a close tolerance flat surface 22 (e.g., its flatness is below $1\mu$ and its roughness is below $0.08\mu$). Thus, a high degree of flatness of the attracted mask 10 is obtained. Further, eight magnetic units $30_1$–$30_8$ (the magnetic unit $30_8$ is not shown) are embedded in the magnetic ring 21 equidistantly along a circumferential direction. Each of the magnetic units $30_1$–$30_8$ has the same structure as that of the magnetic unit $140_1$ as shown in FIG. 2.

Each of the magnetic units $30_1$–$30_8$ of the first embodiment is selectively brought to an attracting state and a non-attracting state in the following manner.

(1) Attracting State

Figure 4B:
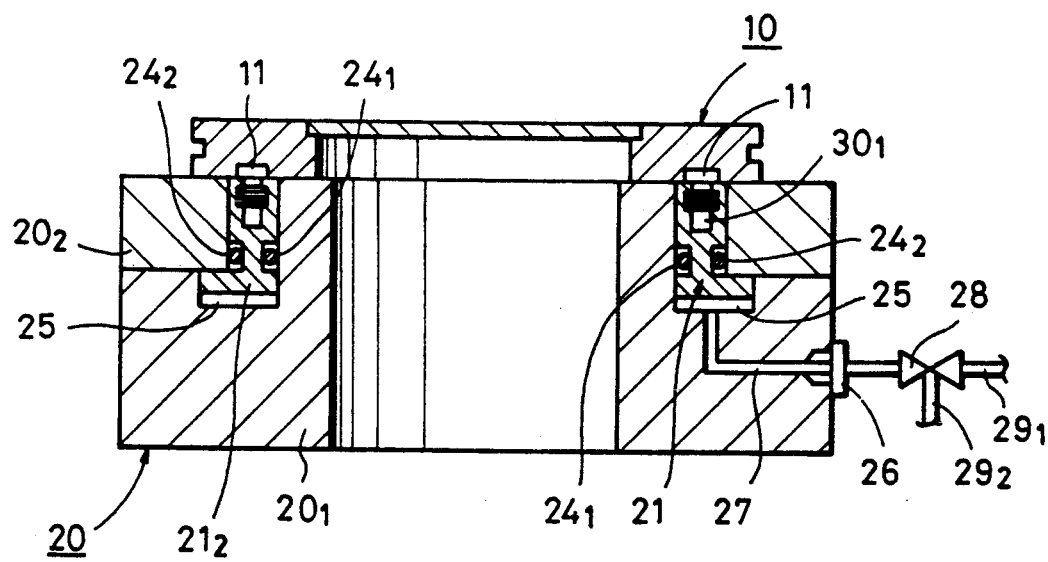
FIG. 4B is a cross-sectional view of the first embodiment in its attracting state.

After the magnetic force of the permanent magnet is eliminated by flowing current into each of the magnetic units $30_1$–$30_8$, the three-way valve 28 is switched to the side of the second line $29_2$ to cause the space 25 to communicate with the He gas bottle. Namely, after the magnetic force of the permanent magnet of each of the magnetic units $30_1$–$30_8$ is eliminated to attain the non-attracting state, He gas is supplied into the space 25 through second line $29_2$, three-way valve 28 and line 27 to displace the magnetic ring 21 upward until the bottom portion $21_2$ thereof is brought into contact with the stepped portion $23_1$ of the groove 23 as shown in FIG. 4B. The upper surface of the magnetic ring 21 thus becomes substantially flush with the chuck surface of the mask stage 20. Thereafter, the magnetic units $30_1$–$30_8$ are brought into the attracting state by switching off the current flowing through the coil of each of the magnetic units $30_1$–$30_8$. Thus, the magnetic ring 11 embedded in the mask 10 is magnetically attracted to the chuck surface of the mask stage.

In this case, the upper surface of the magnetic ring 21 is positively prevented from being above the chuck surface since the upward movement of the magnetic ring 21 is stopped when the bottom portion $21_2$ of the magnetic ring 21 comes to abut against the stepped portion $23_1$ of the groove 23.

(2) Non-Attracting State

After the magnetic force of the permanent magnet is eliminated by flowing current into each of the magnetic units $30_1$–$30_8$, the three-way valve 28 is switched to the side of the first line $29_1$ to cause the space 25 formed in the groove 23 of the mask stage 20 to communicate with the the vacuum source. Namely, the He gas in the space 25 is discharged through line 27, three-way valve 28 and first line $29_1$ by use of the vacuum source to move the magnetic ring 21 downward to a position in which the magnetic force of the permanent magnet of each of the magnetic units $30_1$–$30_8$ is unable to attract the mask 10 on the chuck surface, as shown in FIG. 4A. Here, the upper surface of the magnetic ring 21 is about 1 mm below the chuck surface of the mask stage 20. Thus, each of the magnetic units $30_1$–$30_8$ is brought into the non-attracting state. Thereafter, even if the current flowing through the coil of each of the magnetic units $30_1$–$30_8$ is switched off, the magnetic force of the permanent magnet of each of the magnetic units $30_1$–$30_8$ cannot attract the mask 10 on the chuck surface. Therefore, there is no need to continuously flow current through the coil in order to attain the non-attracting state of each of the magnetic units $30_1$–$30_8$.

Referring now to FIG. 5, there is illustrated an example of the mask transporting or feeding system to be used in an X-ray exposure apparatus including the first embodiment and a synchrotron radiation light source.

The mask feeding system is comprised of a mask feeding apparatus, a mask holding apparatus as shown in FIG. 3 and a V-block 70 for performing positioning of the mask 10.

In the mask feeding apparatus, there are provided a linear guide 41 mounted on a base of an unshown X-ray exposure apparatus, a traverse unit 45 engaging the linear guide 41 so as to slide in an X direction by the force of a motor 44 through a flat belt 43 spanned around four pulleys $42_1$–$42_4$, a base part 47 whose central portion is rotatably pivotted to the traverse unit 45 by a pin 46 projecting in a Z direction, a mask hand 50 mounted to one end of the base part 47 through an arm unit 48 which contains therein a driving source and is displaceable in the Z direction, and a balancer 49 fixed to the other end of the base part 47.

Figure 6:
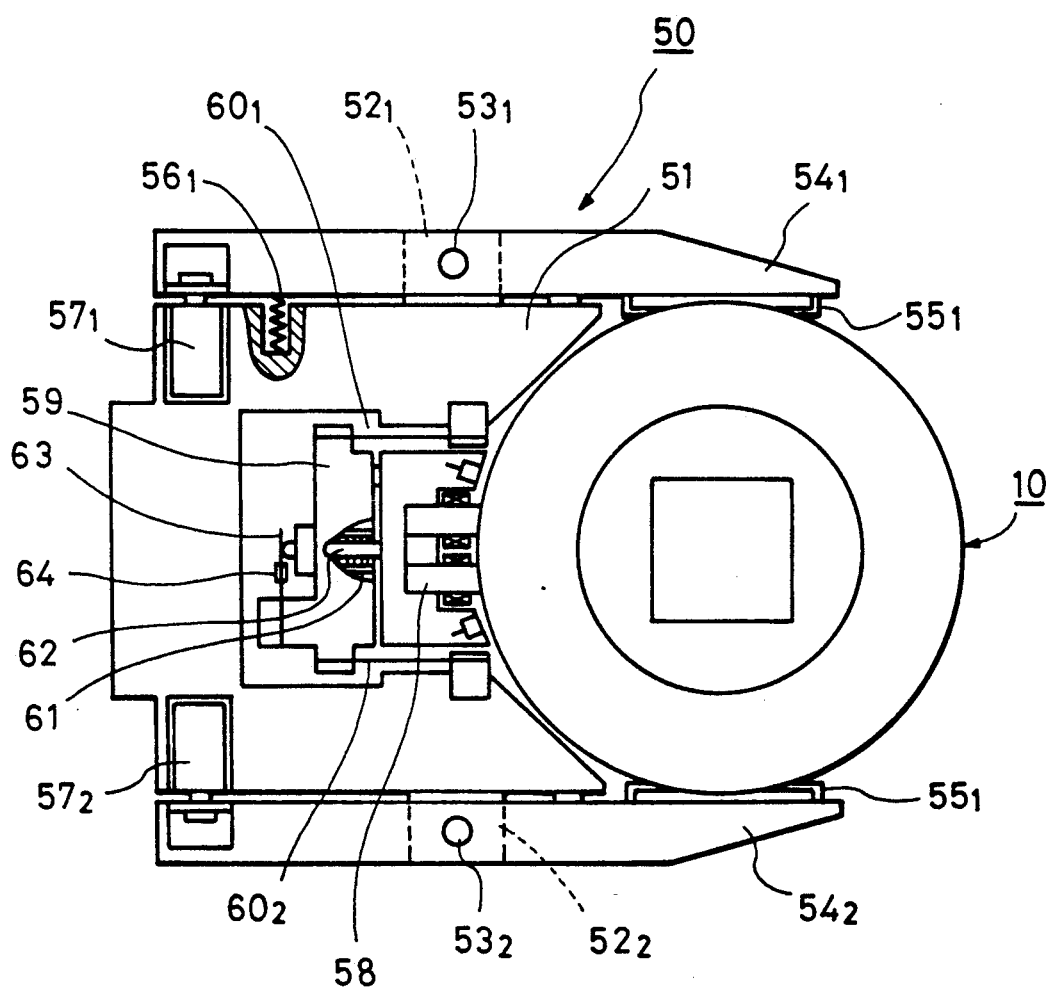
FIG. 6 is a front view of a mask hand shown in FIG. 5.

As shown in FIG. 6, a hand body 51 of the mask hand 50 has a shape of a rectangular letter C, and on both sides of the hand body 51, supporting portions $52_1$ and $52_2$ are disposed so as to project parallel to the surface of the mask 10 to be held. Pins $53_1$ and $53_2$ are studded on the supporting portions $52_1$ and $52_2$, and finger portions $54_1$ and $54_2$ are pivotally supported by the pins $53_1$ and $53_2$. Engaging pieces $55_1$ and $55_2$ are fixed to inner ends of the finger portions $54_1$ and $54_2$, for holding the X-ray mask 10 positively. At the other ends of the finger portions $54_1$ and $54_2$, there are provided, between the hand body 51 and the finger portions $54_1$ and $54_2$, compression springs $56_1$ and $56_2$ (only compression spring $56_1$ is shown) for always biasing the finger portions $54_1$ and $54_2$ in a direction which closes the finger portions $54_1$ and $54_2$ and solenoids $57_1$ and $57_2$ for driving the finger portions $54_1$ and $54_2$ against the forces of the compression springs $56_1$ $56_2$ in a direction which opens the finger portions $54_1$ and $54_2$. By controlling the solenoids $57_1$ and $57_2$, the two finger portions $54_1$ and $54_2$ of the mask hand 50 are opened and closed.

In an inner recess of the hand body 51 of the mask hand 50, a magnet support member 59 is elastically mounted to the hand body 51 by two parallel leaf springs $60_1$ and $60_2$. The magnet support member 59 supports a center attracting portion 58 for magnetically attracting the mask 10. A bearing hole 61 is formed at a central portion of the magnet support member 59. A support rod 62 formed on the center attracting portion 58 is slidably supported by the bearing hole 61 in its axial direction through a slide bearing. Thus, the center attracting portion 58 is displaceable a predetermined minute distance. The support rod 62 projects from a side of the magnet support member 59 opposite to the center attracting portion 58, and its tip abuts a free end of a leaf spring 63 fixed to the magnet support member 59. Therefore, the center attracting portion 58 is always biased towards the mask 10 held by the mask hand 50. When the mask 10 is pushed against the V block 70 disposed parallel to the chuck surface for positioning the mask 10 after the mask 10 held by the mask hand 50 is transported to the mask stage 20 (see FIG. 5), the center attracting portion 58 is shifted by the pushing force in a direction opposite to the mask 10. As a result, the leaf spring 63 is pushed by the support rod 62 so as to be curved. The curvature of the leaf spring 63 is detected by a strain gauge 64 attached to the leaf spring 63, and hence the pushing force stated above is detected.

Figure 7:
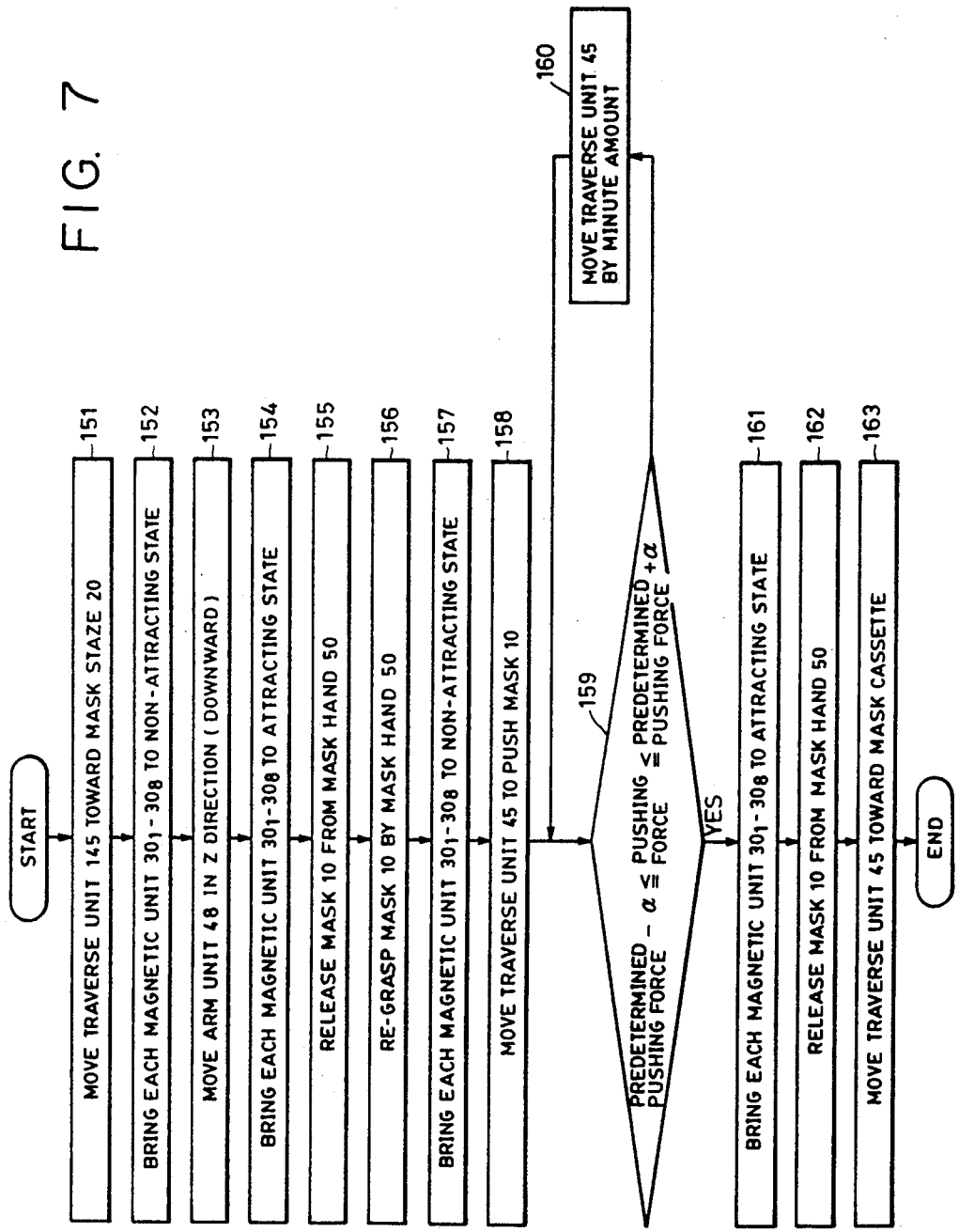
FIG. 7 is a flow chart explaining the operation of the mask transporting system shown in FIG. 5.

The operation of the mask transporting system will be explained referring to a flow chart represented in FIG. 7.

First, the mask 10 is picked out by the mask hand 50 from a mask cassette (not shown) located at the left side in FIG. 5, and the mask hand 50 is rotated by 180° by a rotating mechanism of the base part 47 to which the arm unit 48 is mounted, for causing the mask 10 to face the V block 70. Thereafter, the traverse unit 45 is moved towards the mask stage 20 (step 151). At this time, the plane of the mask 10 held by the mask hand 50 is positioned above the chuck surface of the mask stage 20 in the Z direction. The movement of the traverse unit 45 is terminated before the mask 10 comes into contact with the V block 70. Then, each of the magnetic units $30_1$–$30_8$ (see FIG. 3) is brought to the non-attracting state pursuant to the above-discussed process (step 152), and the arm unit 48 is moved downward in the Z direction (step 153) to bring the mask 10 into contact with the chuck surface. Next, each of the magnetic units $30_1$–$30_8$ is brought to the attracting state pursuant to the above-mentioned process (step 154) to amend the orientation of the mask 10, and the mask 10 is once released from the mask hand 50 (step 155).

After the completion of the amendment of the orientation of the mask 10, the mask 10 is re-grasped by the mask hand 50 (step 156), and each of the magnetic units $30_1$–$30_8$ is again brought to the non-attracting state (step 157). Then, the traverse unit 45 is moved towards the V block 70 to push the mask 10 against the V block 70 (step 158). At this time, the pushing force of the mask 10 is detected by the strain gauge 64 provided in the mask hand 50 so as not to push the mask 10 against the V block 70 excessively due to an excessive movement of the traverse unit 45. A minute displacement of the traverse unit 45 and detection of the pushing force are repeated until the detected pushing force is found to fall within a predetermined range (a predetermined force ± $\alpha$) (steps 159 and 160). When the detected pushing force is within the predetermined range, the movement of the traverse unit 45 is stopped and each of the magnetic units $30_1$–$30_8$ is brought to the attracting state (step 161). Then, the mask 10 is released from the mask hand 50 (step 162), and the traverse unit 45 is returned to the above-mentioned mask cassette. As a result, the mask 10 is attracted and held by each of the magnetic units $30_1$–$30_8$ while a predetermined contact state of the mask 10 with the V block 70 is maintained. Thus, the mask 10 is positioned and held by the mask stage 20.

Consequently, in the mask transporting system, there is no need to cause current to continuously flow through each coil in each of the magnetic units $30_1$–$30_8$ during the mask positioning period indicated by the steps 159 and 160 (e.g., 2–3 seconds) because the mask 10 is attracted and held by the mask holding apparatus as discussed above. Thus, the mask 10 is prevented from being heated during the mask positioning period.

The shape of the mask stage 20 may be square or the like, other than an annular shape. Further, the groove 23 formed in the chuck surface of the mask stage 20 need not be a single continuous one. The groove may be divided into a plurality of parts for respective magnetic units $30_1$–$30_8$. But, in this case, the line 27 should be branched in the mask stage 20 to connect the three-way valve 28 to respective spaces to be formed in the divided groove parts for connecting these spaces to a vacuum source.

In the first embodiment, He gas is used as gas to be supplied into the space 25, but other gases such as air may be used.

Figure 8:
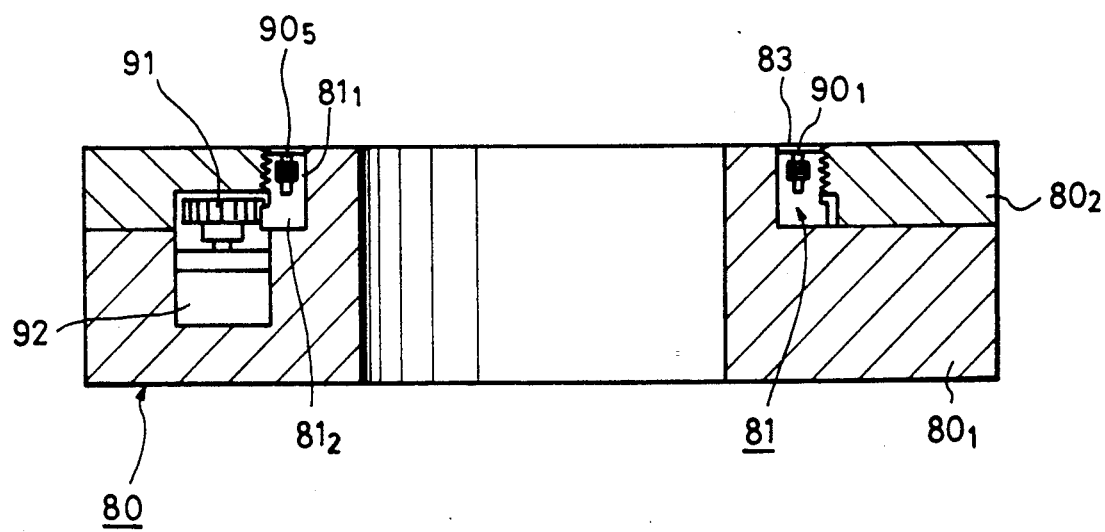
FIG. 8 is a cross-sectional view showing the structure of a second embodiment of a mask holding apparatus of a magnetic-attraction system according to the present invention.

FIG. 8 shows a second embodiment of the mask holding apparatus of the present invention.

The second embodiment differs from the first embodiment shown in FIG. 3 in the following points.

(1) A groove 83 of a mask stage 80 is continuously formed along a circumferential direction, and threads are cut on a surface which defines an outer peripheral surface of the groove 83 at the chuck surface side. Namely, the groove 83 is formed between a first member $80_1$ and a second member $80_2$ which constitute the mask stage 80, and threads are cut on an inner peripheral surface of the second member $80_2$ at the chuck surface side.

(2) Threads engaging with the threads cut on the inner peripheral surface of the second member $80_2$ are cut on an outer peripheral surface of an upper portion $81_1$ of a magnetic ring 81, and longitudinal grooves are cut on an outer peripheral surface of a bottom portion $81_2$ of the magnetic ring 81.

(3) A gear 91 engaging with the longitudinal grooves and a motor 92 for rotating the gear 91 are provided in an inner portion of the mask stage 80 where a magnetic unit $90_5$ is disposed.

The operation for selectively bringing the magnetic units $90_1$–$90_8$ (only two magnetic units $90_1$ and $90_5$ are shown in FIG. 8) to an attracting state and a non-attracting state will hereinbelow be explained.

(1) Attracting State

After the magnetic force of the permanent magnet is eliminated by flowing current into each of the magnetic units $90_1$–$90_8$, the gear 91 is rotated in a clockwise direction by the motor 92 to rotate the magnetic ring 81 in a counterclockwise direction. The magnetic ring 81 is moved upward until the upper surface of the magnetic ring 81 becomes substantially flush with the chuck surface, by the action between the gear cut on the inner peripheral surface of the second member $80_2$ and the gear cut on the outer peripheral surface of the upper portion $81_1$ of the magnetic ring 81. Namely, the rotation of the magnetic ring 81 is converted to linear upward and downward movements thereof. Then, current flowing through the coils in the magnetic units $90_1$–$90_8$ is terminated.

(2) Non-Attracting State

After the magnetic force of the permanent magnet is eliminated by flowing current into each of the magnetic units $90_1$–$90_8$, the gear 91 is rotated in a counterclockwise direction by the motor 92 to rotate the magnetic ring 81 in a clockwise direction. The magnetic ring 81 is moved downward until the upper surface of the magnetic ring 81 becomes about 1 mm below the chuck surface of the mask stage 80, by the action between the the gear cut on the inner peripheral surface of the second member $80_2$ and the gear cut on the outer peripheral surface of the upper portion $81_1$ of the magnetic ring 81. Then, current flowing through each of the coils in the magnetic units $90_1$–$90_5$ is terminated.

Therefore, also in the second embodiment, there is no need to cause the current to continuously flow through the coils in order to attain the non-attracting state of each of the magnetic units $90_1$–$90_8$. Thus, the positioning operation represented by the steps 159 and 160 of FIG. 7 can be effected without generating thermal strain of the mask 10.

The number of the magnetic units is eight in the above-discussed embodiments, but a number other than eight can be used.

While there have been shown and described what are considered preferred embodiments of the present invention, it will be obvious to those skilled in the art that various changes and modifications may be made therein without departing from the invention as defined by the following claims.

What is claimed is:

1. A substrate holding apparatus for holding a substrate to be exposed by radiation, which is transported by a substrate transporting apparatus, said apparatus comprising:

a substrate stage having a substrate holding surface for attracting a substrate, said substrate holding surface being divided into an inner peripheral portion and an outer peripheral portion by at least a groove formed in said substrate stage;

a magnetic member fitted into said groove of said substrate stage;

at least a magnetic unit embedded in said magnetic member, said magnetic unit including a permanent magnet and an electromagnet for eliminating a magnetic force of said permanent magnet when energized; and moving means for moving said magnetic member together with said magnetic unit in a direction of the depth of said groove between a first position in which the magnetic force of said permanent magnet is effective for the substrate on said substrate holding surface and a second position in which the magnetic force of said permanent magnet is ineffective for the substrate on said substrate holding surface.

2. A substrate holding apparatus according to claim 1, wherein said groove has a stepped portion formed between a narrow-width portion at the side of said substrate holding surface and a wide-width portion at its bottom side, said magnetic member includes an upper portion whose width is substantially equal to that of said narrow-width portion of said groove and a bottom portion whose width is substantially equal to that of said wide-width portion of said groove and which forms a space between said bottom portion and said wide-width portion and said moving means comprises means for selectively supplying gas to and discharging gas from said space.

3. A substrate holding apparatus according to claim 2, further comprising sealing means for sealing said space.

4. A substrate holding apparatus according to claim 1, wherein said groove of said substrate stage is continuously formed along a periphery of said mask stage, a first screw is cut on a surface for defining an outer peripheral surface of said groove, a second screw engaging said first screw is cut on an outer peripheral surface of said magnetic member, longitudinal grooves are formed on the outer peripheral surface of said said magnetic member and said moving means includes a gear disposed in said substrate stage for engaging said longitudinal grooves and a motor for rotating said gear.

5. A substrate holding apparatus according to claim 1, wherein said substrate stage has an annular shape.

6. A substrate holding apparatus according to claim 1, wherein a plurality of said magnetic units are disposed equidistantly.

7. A substrate holding apparatus for holding a substrate to be exposed by radiation, which is transported by a substrate transporting apparatus, said apparatus comprising:
   a substrate stage having a substrate holding surface for attracting a substrate;
   at least a magnetic unit movably disposed in said substrate stage, said magnetic unit including a permanent magnet and an electromagnet for eliminating a magnetic force of said permanent magnet when energized; and
   moving means for moving said magnetic unit between a first position in which the magnetic force of said permanent magnet is effective for the substrate on said substrate holding surface and a second position in which the magnetic force of said permanent magnet is ineffective for the substrate on said substrate holding surface.

8. A method for positioning a substrate on a substrate holding surface of a substrate holding apparatus comprising a substrate stage having a substrate holding surface for attracting a substrate, at least one magnetic unit movably disposed in the substrate stage, the magnetic unit including a permanent magnet and an electromagnet for eliminating a magnetic force of the permanent magnet when energized and moving means for moving the magnetic unit between a first position in which the magnetic force of the permanent magnet is effective for the substrate on the substrate holding surface and a second position in which the magnetic force of the permanent magnet is ineffective for the substrate on the substrate holding surface, said method comprising the steps of:
   bringing the magnetic unit to the second position;
   putting the substrate on the substrate holding surface by a substrate transporting apparatus;
   bringing the magnetic unit to the first position;
   disabling the electromagnet;
   releasing the substrate from the substrate transporting apparatus;
   re-grasping the substrate by the substrate transporting apparatus;
   energizing the electromagnet;
   bringing the magnetic unit to the second position;
   disabling the electromagnet;
   positioning the substrate by the substrate transporting apparatus;
   energizing the electromagnet;
   bringing the magnetic unit to the first position;
   disabling the electromagnet; and
   releasing the substrate from the substrate transporting apparatus.

* * * * *

UNITED STATES PATENT AND TRADEMARK OFFICE
CERTIFICATE OF CORRECTION

PATENT NO. : 5,161,177
DATED : November 3, 1992
INVENTOR(S) : Yuji Chiba

It is certified that error appears in the above-identified patent and that said Letters Patent is hereby corrected as shown below:

COLUMN 1

Line 22, "refining such as" should read --refining techniques. In such an--.

COLUMN 5

Line 54, "springs $56_1$ $56_2$" should read --springs $56_1$ and $56_2$--.

COLUMN 9

Line 8, "said said" should read --said--.

Signed and Sealed this

Twenty-sixth Day of October, 1993

Attest:

BRUCE LEHMAN

Attesting Officer     Commissioner of Patents and Trademarks